United States Patent
Kobayashi

(10) Patent No.: US 7,180,546 B2
(45) Date of Patent: Feb. 20, 2007

(54) DEVICES INCLUDING A THERMALLY CONDUCTIVE MEMBER WHICH GUIDES HEAT PRODUCED BY AN IMAGE CAPTURING UNIT TO A DISPLAY CHASSIS

(75) Inventor: Kazuya Kobayashi, Tokyo (JP)

(73) Assignee: Olympus Corporation, Tokyo (JP)

( * ) Notice: Subject to any disclaimer, the term of this patent is extended or adjusted under 35 U.S.C. 154(b) by 603 days.

(21) Appl. No.: 10/278,243

(22) Filed: Oct. 23, 2002

(65) Prior Publication Data
US 2003/0081136 A1 May 1, 2003

(30) Foreign Application Priority Data
Oct. 29, 2001 (JP) ............................. 2001-330772
Sep. 17, 2002 (JP) ............................. 2002-269611

(51) Int. Cl.
*H04N 5/225* (2006.01)
(52) U.S. Cl. ....................... 348/374; 348/373
(58) Field of Classification Search ................ 348/374
See application file for complete search history.

(56) References Cited

U.S. PATENT DOCUMENTS

| | | | | |
|---|---|---|---|---|
| 4,435,732 A | * | 3/1984 | Hyatt | ........................ 348/748 |
| 5,340,978 A | * | 8/1994 | Rostoker et al. | .......... 250/208.1 |
| 6,398,560 B1 | * | 6/2002 | Mizuno | ....................... 439/67 |
| 6,831,424 B2 | * | 12/2004 | Youn et al. | .................. 315/248 |
| 2002/0139853 A1 | * | 10/2002 | Tsikos et al. | .......... 235/462.01 |

FOREIGN PATENT DOCUMENTS

| | | |
|---|---|---|
| JP | 2000-32307 | 1/2000 |
| JP | 2001-189884 | 7/2001 |

* cited by examiner

*Primary Examiner*—Ngoc-Yen Vu
*Assistant Examiner*—Nicholas G. Giles
(74) *Attorney, Agent, or Firm*—Straub and Pokotylo; John C. Pokotylo

(57) ABSTRACT

An LCD having a backlight is inserted in a shield for protecting various types of electronic components used in an electronic camera by shielding static electricity applied to the LCD, and the LCD is held by the shield. In this structure, thermal conductive rubber is interposed between a substrate on which an image capturing element is arranged, and the shield, so that the image capturing unit composed of the image capturing element and the substrate, and the shield are thermally bonded.

17 Claims, 8 Drawing Sheets

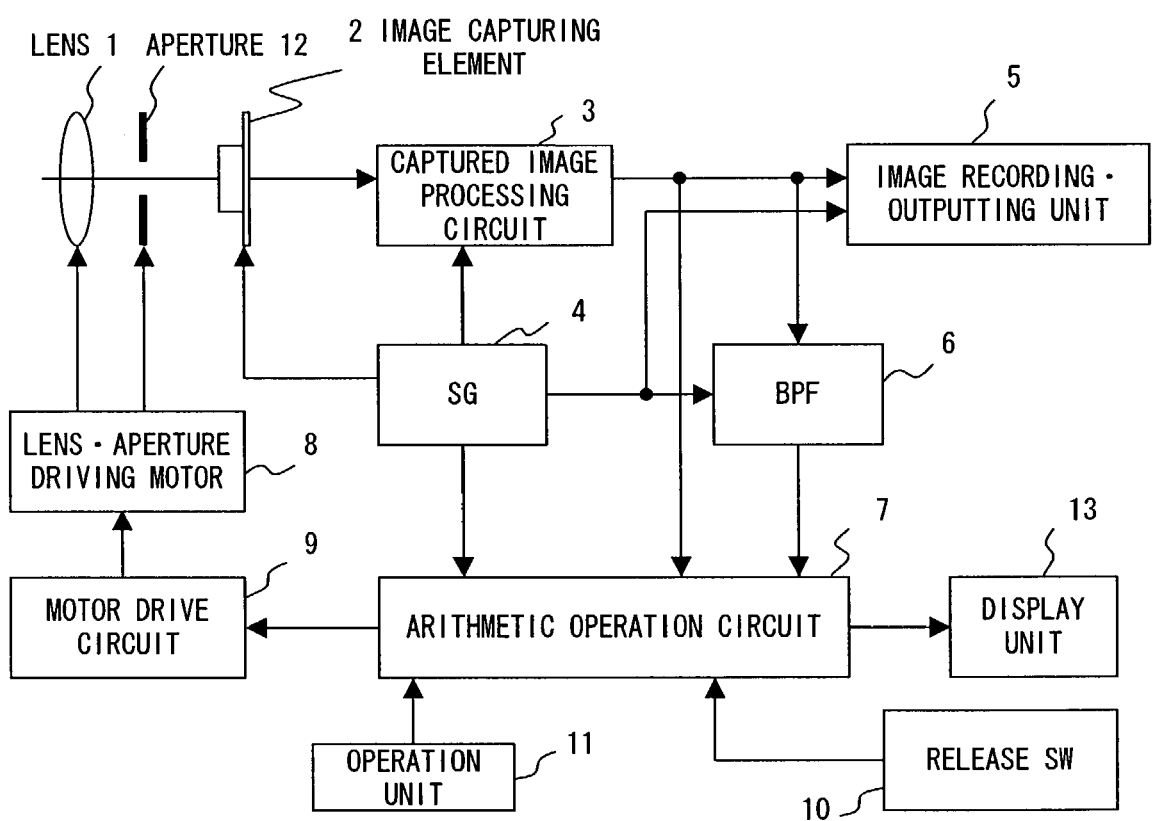
F I G. 1

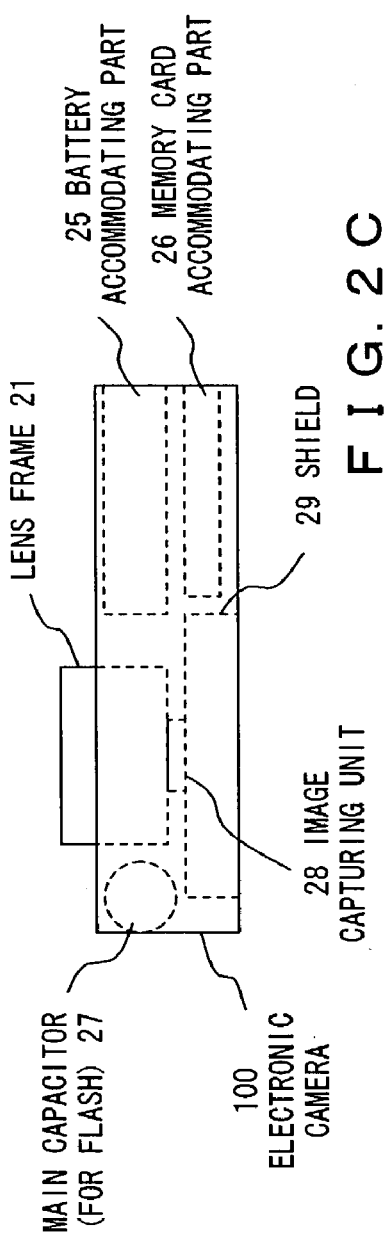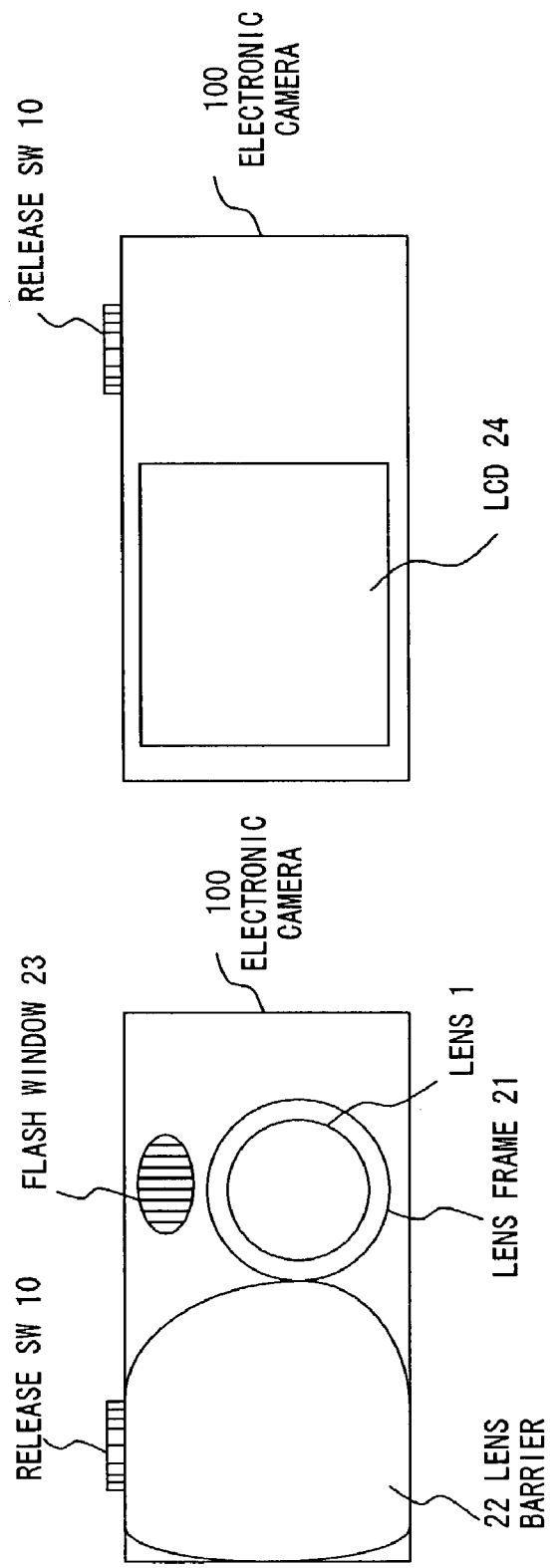

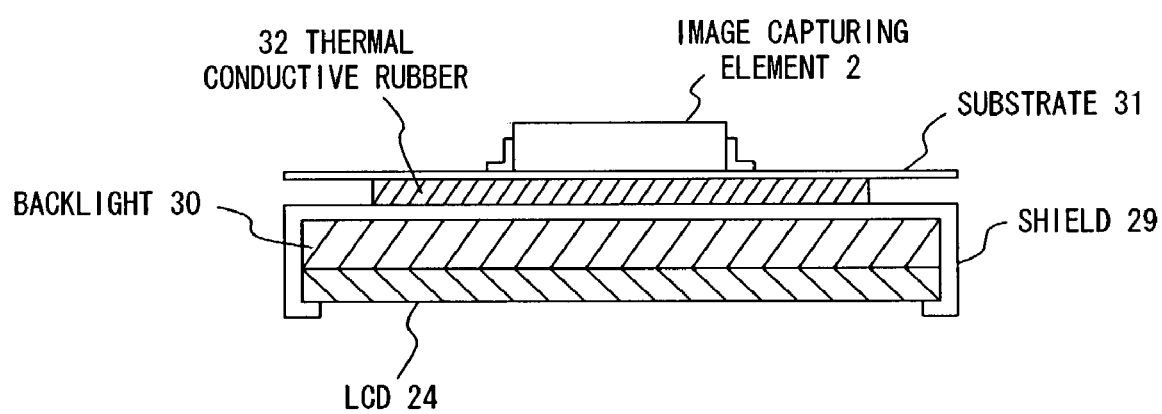
F I G. 3

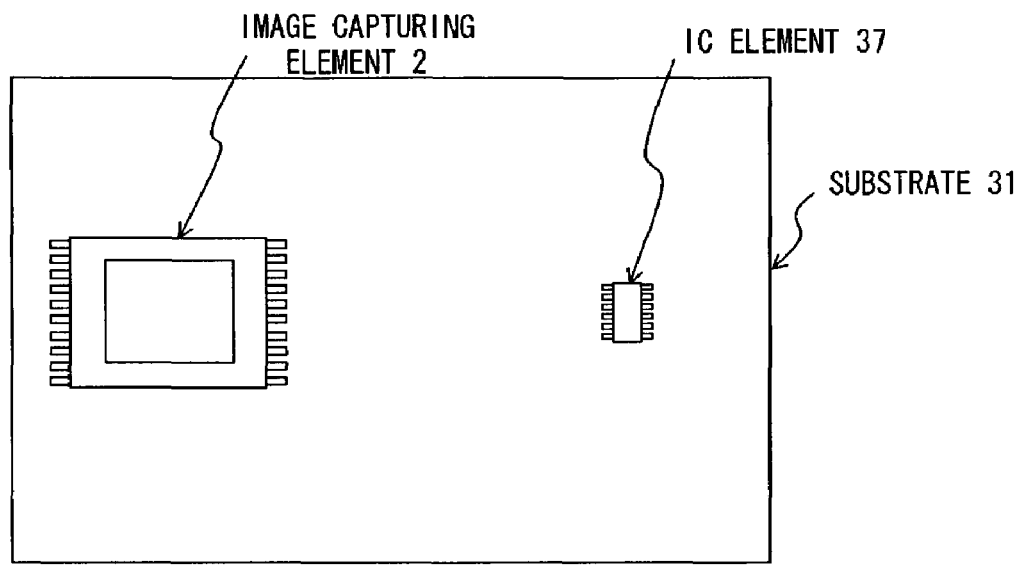
F I G. 6 A
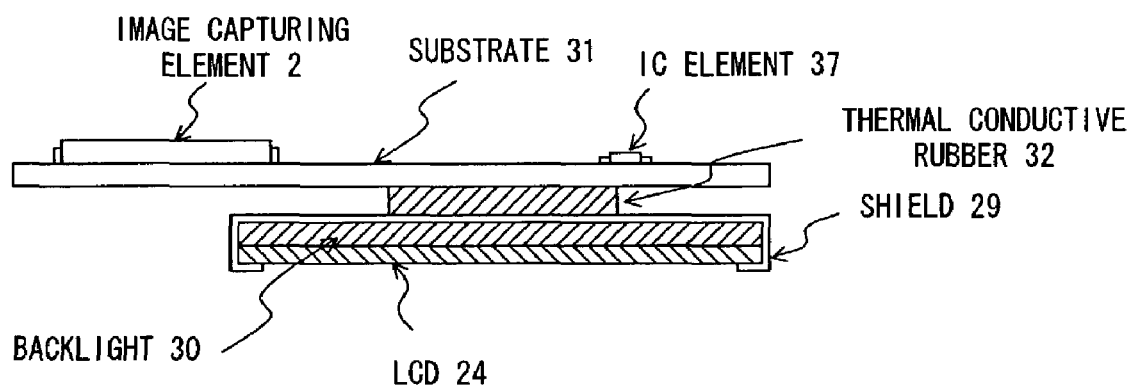
F I G. 6 B

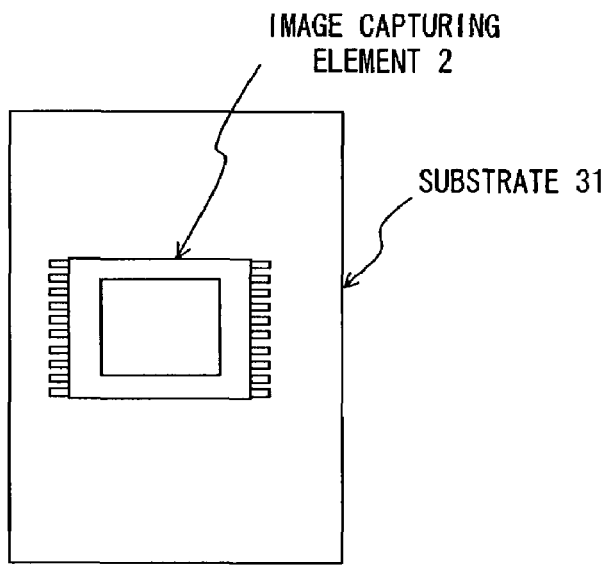
F I G. 7 A
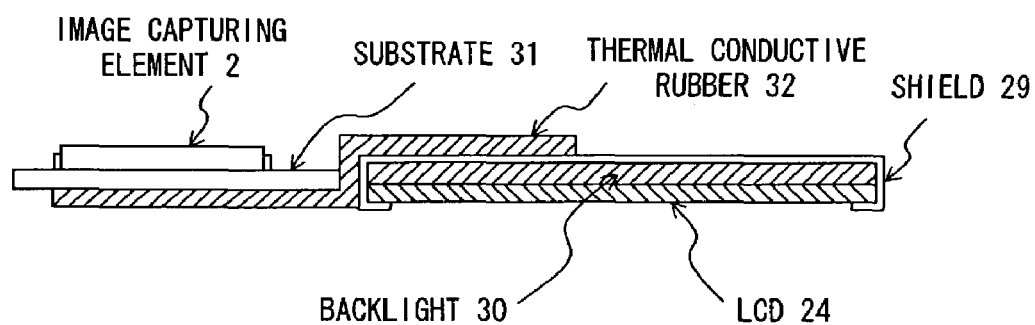
F I G. 7 B
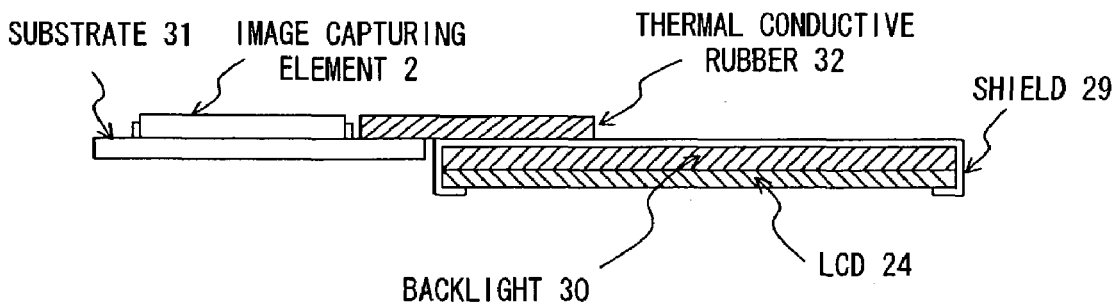
F I G. 7 C

DEVICES INCLUDING A THERMALLY CONDUCTIVE MEMBER WHICH GUIDES HEAT PRODUCED BY AN IMAGE CAPTURING UNIT TO A DISPLAY CHASSIS

BACKGROUND OF THE INVENTION

1. Field of the Invention

The present invention relates to a technique for use in an image capturing device of an electronic camera, etc., and more particularly, to a technique for improving the image quality of a captured image.

2. Description of the Related Art

In recent years, an image capturing device, which uses a solid-state image capturing element such as a CCD (Charge Coupled Device), etc. as an image capturing element that converts a subject image into an electric signal, has become widespread.

Since a solid-state image capturing element is normally configured by using a semiconductor, noise caused by heat occurs within the element. This thermal noise (also called dark noise, etc.) monotonously increases with a rise in the temperature of the element. Therefore, if an image is captured by dropping the temperature of an image capturing element as low as possible, thermal noise less occurs, and the image quality of the captured image becomes better. Accordingly, for example, some image capturing devices used to shoot an astronomical photo comprise a cooling device for an image capturing element in order to obtain an image of high quality.

As described above, it is desirable to operate a solid-state image capturing device at a temperature as low as possible in terms of the image quality of a captured image. However, the solid-state image capturing element is an active element, and produces heat at the time of operations. Also heat produced by an element arranged on the periphery of the solid-state image capturing element exerts a significant influence on the solid-state image capturing element. Accordingly, most image capturing devices have a mechanism for radiating the heat produced by an image capturing element itself, or heat produced by an element arranged on its periphery by bonding a radiator such as a metal plate, etc. to the image capturing element.

However, the demand for further reducing digital cameras, which have become widespread in these days, in size, thickness, and weight is high. This poses a problem that a dedicated space where a radiator for an image capturing element is arranged cannot be secured within the chassis of a digital camera.

SUMMARY OF THE INVENTION

An object of the present invention is to radiate the heat of a solid-state image capturing element, which is suitable for reducing an image capturing device in size and thickness without arranging a dedicated radiator, in view of the above described problem.

To achieve the aforementioned object, an image capturing device, which is one aspect of the present invention, is configured to comprise an image capturing unit in which a solid-state image capturing element converting a subject image into an electric signal is arranged, and a display chassis that holds an image display unit on which an image to be recorded or replayed is displayed, and is thermally bonded to the image capturing unit.

Thermal bonding means that both of the image capturing unit and the display chassis are bonded to realize a good heat transfer characteristic.

With this configuration, the heat produced by the solid-state image capturing element, or heat produced by an element, which exerts a thermal influence on the solid-state image capturing element, is transferred to the display chassis and radiated, so that the solid-state image capturing element is cooled. Accordingly, a captured image of good image quality can be obtained without arranging a radiator dedicated to the solid-state image capturing element.

The above described image capturing device according to the present invention can be configured to further comprise a display illuminating unit, which is placed on the back side of the image display unit and arranged between the image display unit and the display chassis, illuminates the image display unit.

With this configuration, even if an ambient environment is in the dark when a self-illumination type is not used as the image display unit, an image displayed on the image display unit can be visually identified.

Additionally, in the above described image capturing device according to the present invention, the display chassis can be configured to shield static electricity applied to the image display unit.

With this configuration, tolerance of static electricity applied to the image display unit is improved, so that a malfunction or a fault caused by the static electricity is less prone to occur.

Furthermore, in the above described image capturing device according to the present invention, the display chassis can be configured to enhance the physical strength of the image display unit by holding the image display unit.

This configuration is intended to physically reinforce the image display unit with the display chassis. With this configuration, tolerance of a physical impact against the image display unit is improved.

Still further, in the above described image capturing device according to the present invention, the image capturing unit can be configured to comprise a substrate on which the solid-state image capturing element is arranged, and the substrate can be configured to be placed as opposed to the display chassis.

With this configuration, the substrate and the display chassis are placed as opposed to each other, so that a wide area for the thermal bonding can be easily secured, and a heat transfer from the image capturing unit to the display chassis can be further improved.

Still further, in the above described image capturing device according to the present invention, the display chassis can be also configured to be thermally bonded to the image capturing unit by arranging a thermal conductive member, which guides the heat produced by the image capturing unit to the display chassis, between the image capturing unit and the display chassis.

With this configuration, the display chassis can be also configured to be thermally bonded to the image capturing unit by interposing the thermal conductive member between the image capturing unit and the display chassis.

Note that the thermal conductive member means a member whose thermal conductivity characteristic is good. Examples of the thermal conductive member include metal, a member which contains silicon in order to obtain a good thermal conductivity characteristic, and the like.

With this configuration, the heat produced by the solid-state image capturing element can be well transferred to the display chassis.

If the thermal conductive member has elasticity at this time, a certain degree of freedom can be provided to the physical position relationship between the image capturing unit and the display chassis. For example, if the position of a shooting unit is structured to be adjustable due to an optical reason, the heat produced by the solid-state image capturing element can be well transferred to the display chassis in this way. Examples of the thermal conductive member having elasticity include a metal spring, thermal conductive rubber (silicon rubber) which contains silicon in order to obtain a good thermal conductivity characteristic.

Additionally, at this time, the display chassis, the solid-state image capturing element, and the thermal conductive member can be configured to be placed on the same axis.

With this configuration, the physical distance between the solid-state image capturing element which produces heat or an element which exerts a thermal influence on the solid-state image capturing element, and the display chassis that radiates the heat becomes short, thereby improving heat radiation efficiency.

Furthermore, at this time, the image capturing unit can be also configured to comprise a substrate on which the solid-state image capturing element is arranged, and the display chassis can be also configured to be thermally bonded to the image capturing unit by arranging the thermal conductive member between the substrate and the display chassis.

With this configuration, the thermal conductive member is arranged between the substrate on which the solid-state image capturing element is arranged, and the display chassis, whereby the degree of freedom of the position relationship between the solid-state image capturing element arranged on the substrate and the image display unit held by the display chassis can be enhanced.

Additionally, at this time, the image display unit held by the display chassis and the substrate can be configured to be placed side by side, and the thermal conductive member can be configured to be bonded to the arrangement surface of the solid-state image capturing element on the substrate, or the back side of the arrangement surface.

With this configuration, the substrate on which the solid-state image capturing element is arranged, and the display unit held by the display chassis are placed side by side, thereby thinning the image capturing device in comparison with the placement implemented by stacking the substrate and the display chassis.

Furthermore, in the above described image capturing device according to the present invention, the display chassis can be configured to radiate the heat produced by the solid-state image capturing element arranged in the image capturing unit, or the heat of the element which exerts a thermal influence on the solid-state image capturing element, and to also radiate the heat produced by a semiconductor element arranged in the image capturing unit.

With this configuration, a malfunction caused by the heat that can be possibly produced by the semiconductor element arranged in the image capturing unit can be prevented.

An image capturing device, which is another aspect of the present invention, achieves the above described object by being configured to comprise an image capturing unit in which a solid-state image capturing element converting a subject image into an electric signal is arranged, and a static electricity shielding unit that shields static electricity applied to an image display unit on which an image to be recorded or replayed is displayed, and is thermally bonded to the image capturing unit.

With the above described configuration, the heat produced by the solid-state image capturing element is transferred to the static electricity shielding unit, which is intended to improve the tolerance of the static electricity applied to the image display unit, and the heat is radiated from the static electricity shielding unit, thereby eliminating the need for a radiator dedicated to the solid-state image capturing element.

In the above described image capturing device according to the present invention, the static electricity shielding unit can be also configured to be thermally bonded to the image capturing unit by interposing a thermal conductive member between the image capturing unit and the static electricity shielding unit.

With this configuration, the heat produced by the solid-state image capturing element can be well transferred to the static electricity shielding unit.

BRIEF DESCRIPTION OF THE DRAWINGS

The present invention will be more apparent from the following detailed description when the accompanying drawings are referenced.

FIG. 1 shows the configuration of an electronic camera implementing the present invention;

FIGS. 2A, 2B, and 2C show the outline of the structure of the electronic camera implementing the present invention;

FIG. 3 shows a first method for thermally bonding an image capturing unit and a shield;

FIGS. 6A and 6B show a fourth method for thermally bonding an image capturing unit and a shield;

FIGS. 7A, 7B, and 7C show fifth and sixth methods for thermally bonding an image capturing unit and a shield.

DESCRIPTION OF THE PREFERRED EMBODIMENTS

Figure 4A:
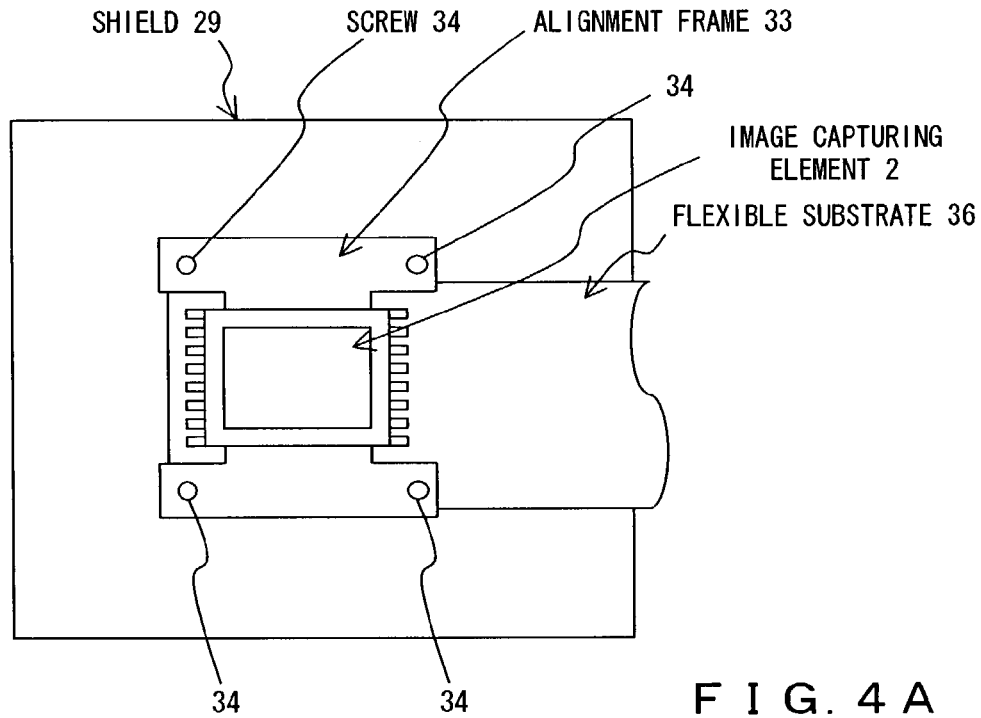
FIGS. 4A and 4B show a second method for thermally bonding an image capturing unit and a shield.

Hereinafter, preferred embodiments according to the present invention are described with reference to the drawings.

FIG. 1 shows the electric configuration of an electronic camera, which is an image capturing device implementing the present invention.

The electronic camera (hereinafter referred to as "this device") shown in FIG. 1 is configured to comprise: a lens 1 which forms a subject image on a light-receptive surface of an image capturing element 2; an aperture 12 which restricts the amount of light incident to this device via the lens 1 depending on need; a lens/aperture driving motor 8 used to move the lens 1 for focusing, or to adjust the aperture 12 for suitable exposure; a motor drive circuit 9 which controls the lens/aperture driving motor 8; an image capturing element 2 which converts the subject image formed by the lens 1 into an electric signal; a captured image processing circuit 3 which performs processes such as amplification, sample and hold, analog/digital conversion, luminance/color conversion, etc. for the electric signal output from the image capturing element 2; an SG circuit (pulse generation circuit) 4 which generates a reference signal (various types of pulse signals such as horizontal and vertical synchronization signals, etc.) required for image signal processing; an image recording/outputting unit 5 which outputs an image signal representing the subject image to an image recording/ replaying system not shown; a BPF (Band Pass Filter) circuit 6 which extracts from a luminance signal within the image signal a high-frequency component for evaluating the degree of focusing of the subject image at the position of the image capturing element 2; an arithmetic operation circuit 7 configured by a CPU (Central Processing Unit), a ROM, a RAM, etc.; a display unit 13 which displays various types of information such as a shooting condition, etc., or a captured image according to an instruction from the arithmetic operation circuit 7; a release SW (switch) 10 which obtains an instruction to record an image signal from a shooter, which is represented by a press operation; and an operation unit 11 which obtains an instruction to change the setting of a shooting condition from the shooter, which is represented by an operation, and also obtains contents of the change.

Outline of the operations of this device shown in FIG. 1 is explained next.

Firstly, subject light is incident to this device via the lens 1, and formed as a subject image on the light-receptive surface of the image capturing element 2, which is a CCD. Processes such as amplification, sample and hold, analog/digital conversion, luminance/color conversion, etc. are performed by the captured image processing circuit 3 for an image signal, which is an electric signal that represents the subject image being the output from the image capturing element 2. The signal is then transmitted to the image recording/outputting unit 5, the BPF circuit 6, and the arithmetic operation circuit 7.

The image signal transmitted to the image recording/outputting unit 5 is output to an inputting unit of the image recording/replaying system not shown.

In the BPF circuit 6, a high-frequency component, which is part of the frequency component of a luminance (Y) signal within the input image signal, is extracted. Largeness/smallness of the amount of the high-frequency component can be recognized to correspond to highness/lowness of the contrast of the image represented by the image signal. Furthermore, a process for integrating the amount of the high-frequency component is performed in the BPF circuit 6, and an integrated value is output to the arithmetic operation circuit 7.

It can be generally recognized that the higher the contrast of an image, the more accurate its focusing. Therefore, the arithmetic operation circuit 7 drives the lens/aperture driving motor 8 to move the lens 1 back and forth when viewed from the image capturing element 2 while controlling the motor drive circuit 9, and sets the position of the lens 1 when the above described integrated value obtained from the BPF circuit 6 becomes maximum as a focusing position. The above described operations are one method type of an AF, which is generally called a "hill climbing method".

In the arithmetic operation circuit 7, the above described AF process is performed, and at the same time, the process for integrating the luminance (Y) signal within the image signal obtained from the captured image processing circuit 3, namely, a photometering process is performed. Then, based on a result of the photometering process, an electric charge accumulation time period in the image capturing element 2, namely, setting control of the shutter speed of a so-called element shutter, and setting control of the aperture 12, which is performed by driving the lens/aperture driving motor 8 while controlling the motor drive circuit 9, namely, an AE (Automatic Exposure) process are performed.

In the arithmetic operation circuit 7, also a white balance (WB) process based on a color difference (C) signal within the image signal is performed.

Here, the arithmetic operation circuit 7 first sets from which area within an image screen information that becomes the basis of the AF, the AE, and the WB control processes is obtained by using a vertical synchronization (VD) signal and a horizontal synchronization (HD) signal of the image signal obtained from the SG circuit 4, and then performs the control processes. This setting can be also configured to be changeable by a user of this device.

In the arithmetic operation circuit 7, processes such as a process for changing various types of parameters for setting a shooting condition according to an operation that the user of this device performs with the operation unit 11 are further performed.

FIGS. 2A, 2B, and 2C are explained next. These figures show the outline of the structure of the electronic camera implementing the present invention. FIGS. 2A and 2B respectively show the front and the back views of this electronic camera. FIG. 2C is the perspective view showing the internal structure of the electronic camera when viewed from the top side.

The same constituent elements in FIGS. 2A, 2B, and 2C as those shown in FIG. 1 are denoted with the same reference numerals.

As shown in FIG. 2A, a lens frame 21 is arranged in a central portion slightly toward the right on the front of the chassis of an electronic camera 100, and the lens frame 21 holds the lens 1. Additionally, a lens barrier 22 for protecting the lens 1 when shooting is not made is arranged on the front of the chassis. This lens barrier 22 can be moved to the left and the right. FIG. 2A shows the state where the lens barrier 22 is open, namely, the state where the lens barrier 22 is moved to the left at the time of shooting when viewed from the front of the chassis. When the lens barrier 22 is moved to the right when viewed from the front of the chassis, the lens barrier 22 is closed, so that the lens 1 is protected from an external impact.

In addition, the release SW 10 is arranged at the left end on the top of the chassis of the electronic camera 100 when viewed from the front of the chassis, and a flash window 23 from which flash light used for night shooting is emitted is arranged in an upper portion of the front of the chassis.

Additionally, as shown in FIG. 2B, an LCD (Liquid Crystal Display) 24 that functions as the display unit 13 is arranged on the back side of the chassis of the electronic camera 100.

Furthermore, as shown in FIG. 2C, a battery accommodating part 25 accommodating a battery, which is a power source of the electronic camera 100, and a memory card accommodating part 26 accommodating a memory card on which an image signal output from the image recording/outputting unit 5 is recorded are arranged at the right end within the chassis of the electronic camera 100. Still further, a main capacitor 27 of large capacity, which is used for a step-up voltage circuit intended to obtain a high voltage required for the operations of the flash for night shooting is placed at the left end within the chassis of the electronic camera 100.

Still further, the image capturing unit 28, in which the image capturing element 2 is arranged to place the light-receptive surface of the image capturing element 2 at the position where the lens 1 held by the lens frame 21 forms a subject image, is arranged. Still further, a shield 29 for protecting various types of electronic components used in the electronic camera 100 by shielding static electricity applied to the LCD 24 is arranged to surround the back side of the LCD 24. The image capturing unit 28 and the shield 29 are thermally bonded to well transfer the heat produced by the image capturing unit 28 to the shield 29 so that the shield 29 also functions as a radiator for cooling the image capturing element 2 by radiating the heat produced by the image capturing unit 28.

Some methods for thermally bonding an image capturing unit 28 and a shield 29 are explained below. In the following explanation, the same constituent elements as those shown in FIGS. 1, 2A, 2B, and 2C are denoted with the same reference numerals.

FIG. 3 shows the first method for thermally bonding an image capturing unit 28 and a shield 29, and also shows the state of the electronic camera 100 when viewed from the bottom side of the electronic camera 100 in the case where the image capturing unit 28 and the shield 29 are comprised by the electronic camera 100. Namely, this figure shows the details of an enlarged portion of the image capturing unit 28 and the shield 29 in FIG. 2C.

Here, the LCD 24 is a display element having a light transmitting nature. As shown in FIG. 3, a backlight 30 that illuminates the screen display of the LCD 24 is arranged on the back side, which is the reverse side of the display screen of the LCD 24. The LCD 24 having the backlight 30 is inserted in the shield 29 shaped like a concave, so that the LCD 24 is held by the shield 29, and the strength of the LCD 24 against a physical impact is reinforced. As a material of the shield 29, a metal whose thermal conductivity is good is preferable. For example, aluminum is very much preferable as the material of the shield 29, since it has good thermal conductivity, and is lightweight, easy to process, and cheap. Or, for example, copper may be available if importance is placed on its high thermal conductivity.

In FIG. 3, the image capturing unit 28 is configured by the image capturing element 2 and the substrate 31 on which the image capturing element 2 is arranged. Thermal conductive rubber 32 is interposed between the substrate 31 and the shield 29, which are placed as opposed to each other, so that the image capturing unit 28 and the shield 29 are thermally bonded by the thermal conductive rubber 32. As the thermal conductive rubber 32, a material having high thermal conductivity, for instance, silicon rubber is used. In the example shown in FIG. 3, elasticity is not necessarily required as the characteristic of the thermal conductive rubber 32. However, it is desirable that the thermal conductive rubber 32 has elasticity so as to absorb an error of the placement of the shield 29 and the image capturing unit 28 within the electronic camera 100. Furthermore, if insulation processing such as coating of a paint having an insulation characteristic on the surface of the substrate 31, or the like is performed, also an electric insulation nature is not necessarily required as the characteristic of the thermal conductive rubber 32.

Note that thermal conductivity from the arrangement surface of the image capturing element 2 on the substrate 31 to its back side may be improved by arranging many through holes of a copper wire on the substrate 31.

Figure 4B:
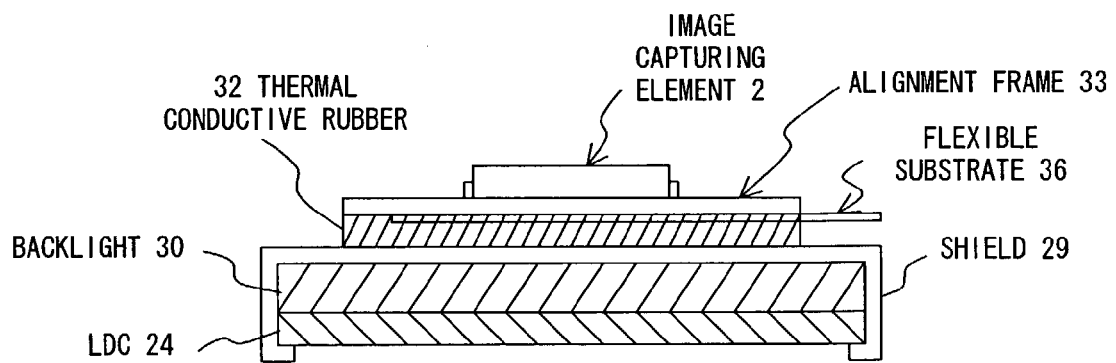

FIGS. 4A and 4B are explained next. There figures show the second method for thermally bonding an image capturing unit 28 and a shield 29. FIG. 4A shows the state of the placement structure of the image capturing unit 28 and the shield 29 when viewed from the front side of the electronic camera 100 in the case where the image capturing unit 28 and the shield 29 are comprised by the electronic camera 100. FIG. 4B shows the state of the placement structure when viewed from the bottom side of the electronic camera 100 in a similar case.

In FIGS. 4A and 4B, a difference from the first method shown in FIG. 3 exists in a point that an image capturing unit 28 is configured to comprise an image capturing element 2, a flexible substrate 32, and an alignment frame 33. Thermal conductive rubber 32 is interposed between the image capturing unit 28 and the shield 29, so that the image capturing unit 28 and the shield 29 are thermally bonded by the thermal conductive rubber 32.

Here, the flexible substrate 36 is electrically connected to various types of input/output terminals possessed by the image capturing element 2. Via the flexible substrate 36, power is supplied to the image capturing element 2, and various types of electric signals are transmitted/received to/from an electronic circuit possessed by the electronic camera 100.

To the alignment frame 33, the image capturing element 2 is bonded to be arranged. The four corners of the alignment frame 33 are fastened to a lens frame 21 with screws 34. By varying the tightness of fastening the screws 34, the position or the orientation of the light-receptive surface of the image capturing element 2 against the lens frame 21 can be finely adjusted. With this adjustment, the subject image that is formed by the lens 1 held by the lens frame 21 can be more accurately formed on the light-receptive surface of the image capturing element 2.

With the second method, the image capturing unit 28 having such a configuration and the shield 29 are thermally bonded by the thermal conductive rubber 32 as shown in FIG. 4B. A material having high thermal conductivity, for example, silicon rubber is also used as the thermal conductive rubber 32 that is interposed between the image capturing unit 28 and the shield 29 in a similar manner as in the example shown in FIG. 3. In the example shown in FIGS. 4A and 4B, the image capturing unit 28 is held by the lens frame 21, and the shield 29 is held by a different constituent element, for example, the chassis of the electronic camera 100. Accordingly, bad influence is prevented from being exerted on the above described alignment adjustment of the image capturing element 2. Elasticity possessed by the thermal conductive rubber 32 is therefore a preferable characteristic.

Figure 5A:
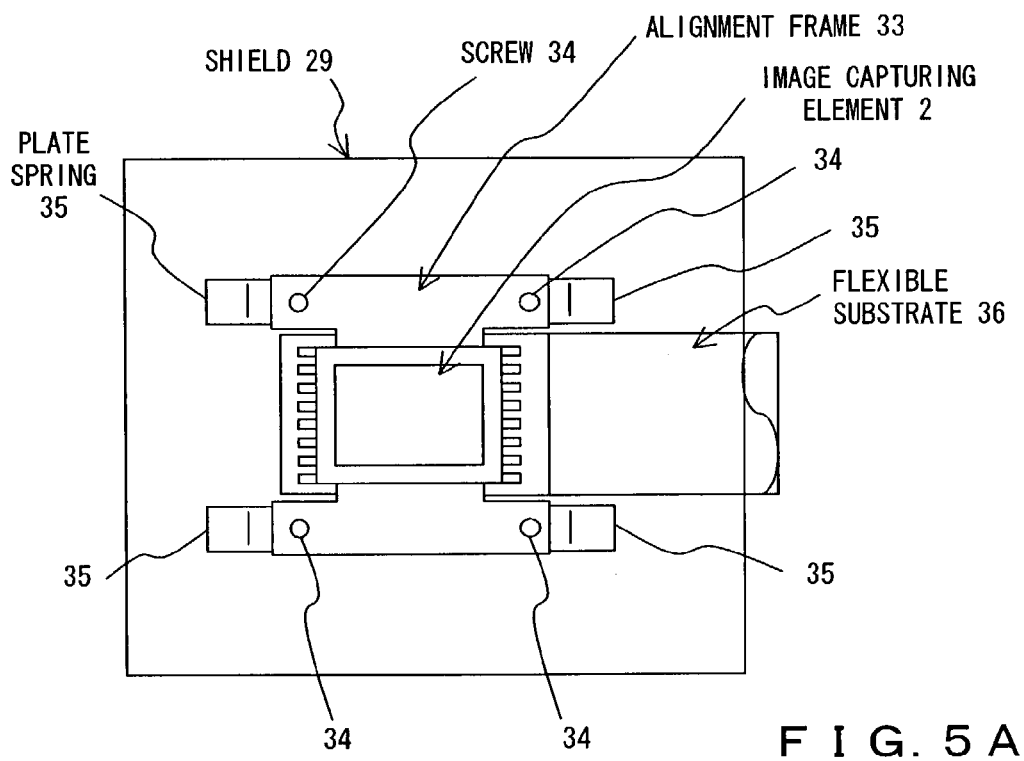
FIGS. 5A and 5B show a third method for thermally bonding an image capturing unit and a shield.
Figure 5B:
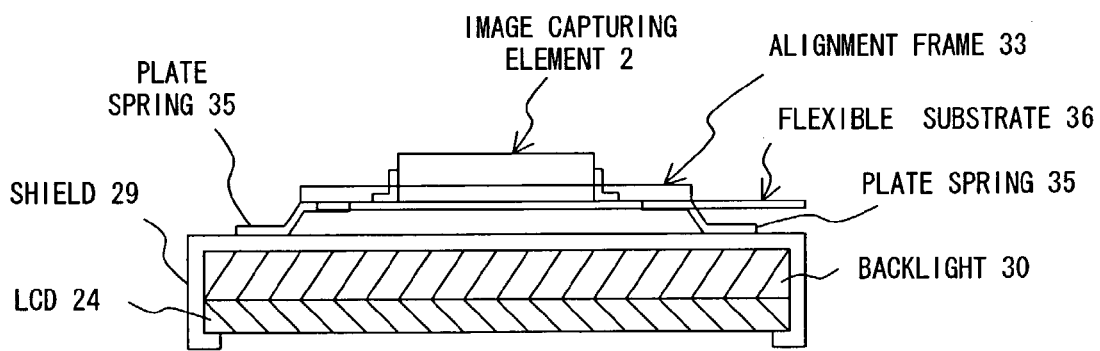

FIGS. 5A and 5B are explained next. These figures show the third method for thermally bonding an image capturing unit 28 and a shield 29. FIG. 5A shows the state of the placement structure of the image capturing unit 28 and the shield 29 when viewed from the front side of the electronic camera 100 in the case where the image capturing unit 28 and the shield 29 are comprised by the electronic camera 100. FIG. 5B shows the state of the placement structure when viewed from the bottom side of the electronic camera 100 in a similar manner.

In FIGS. 5A and 5B, a difference from the second method shown in FIGS. 4A and 4B exists in a point that an image capturing unit 28 and a shield 29 are thermally bonded by interposing plate spring 35 composed of a thin metal plate between the image capturing unit 28 and the shield 29 as a replacement for the thermal conductive rubber 32. As described above, also metal spring having elasticity can be used as a thermal conductive member used to thermally bond the image capturing unit 28 and the shield 29.

FIGS. 6A and 6B are explained next. These figures show the fourth method for thermally bonding an image capturing unit 28 and a shield 29. FIG. 6A shows the state of the placement structure of the image capturing unit 28 and the shield 29 when viewed from the front side of the electronic camera 100 in the case where the image capturing unit 28 and the shield 29 are comprised by the electronic camera 100. FIG. 6B shows the state of the placement structure when viewed from the bottom side of the electronic camera 100 in a similar case.

Comparing with the first method shown in FIG. 3, the point that a substrate 31 on which an image capturing element 2 is arranged is as opposed to the shield 29, and the substrate 31, which is the image capturing unit 28, and the shield 29 are thermally bonded by interposing thermal conductive rubber 32 between the image capturing unit 28 and the shield 29 is similar in the fourth method shown in FIGS. 6A and 6B. However, in the fourth method, a difference from the first method exists in a point that the thermal conductive rubber 32 contacts the substrate 31 at a position apart from the exactly reverse position of the arrangement position of the image capturing element 2 on the substrate 31, and the image capturing element 2, the thermal conductive rubber 32, and the shield 29 are not placed on the same axis.

With the fourth method, its heat radiation efficiency of the image capturing element 2 is not so high as the above described first method. However, this method is effective in the case where the amount of heat produced by the image capturing element 2 is small, or in the case where a desired image capturing characteristic can be obtained only by slightly radiating the heat produced by the image capturing element 2. Additionally, unlike the first method, there is no need to place the image capturing element 2 and an LCD 24 on the same axis. Therefore, a higher degree of freedom can be provided to a design of the chassis of the electronic camera 100.

Note that thermal conductivity from the arrangement portion of the image capturing element 2 on the substrate 31 to the contact portion of the thermal conductive rubber 32 may be improved by arranging a copper wire via through holes from the arrangement portion of the image capturing element 2 on the substrate 31 to the contact portion of the thermal conductive rubber 32. Or, conductive rubber 32 that is large enough to cover also the exactly reverse position of the arrangement position of the image capturing element 2 on the substrate 31 may be interposed between the substrate 31 and the shield 29.

In FIGS. 6A and 6B, an IC (Integrated Circuit) element 37, which produces heat at the time of operations, is arranged on the substrate 31. In the configuration shown in FIGS. 6A and 6B, also the heat produced by the IC element 37 as well as that produced by the image capturing element 2 is radiated by the shield 29. In this way, the heat produced by the IC element 27 is prevented from exerting a bad influence on the image capturing element 2, and at the same time, a malfunction of the IC element 37, which can be possibly caused by the produced heat, is prevented. In this case, a heat transfer from the IC element 37 to the image capturing element 2 can be suppressed, and the heat produced by the IC element 37 can be radiated to the shield 29, if the thermal conductive rubber 32 is thermally bonded to be placed at least between the image capturing element 2 and the IC element 37 as shown in FIG. 6B.

FIGS. 7A, 7B, and 7C are explained next. These figures show the fifth and the sixth methods for thermally bonding an image capturing unit 28 and a shield 29. FIG. 7A shows the state of the placement structure of the image capturing element 28 and the shield 29 when viewed from the front side of the electronic camera 100 in the case where the image capturing unit 28 and the shield 29 are comprised by the electronic camera 100 on the condition that the fifth or the sixth method is implemented. FIG. 7B shows the first example of the state of the placement structure when viewed from the bottom side of the electronic camera 100 on the condition that the fifth method is implemented, whereas FIG. 7C shows the second example of the state of the placement structure when viewed from the bottom side of the electronic camera 100 on the condition that the sixth method is implemented. It should be noted that the shield 29 and the thermal conductive rubber 32 are not shown in FIG. 7A.

Comparing with the first method shown in FIG. 3, the point that the substrate 31 on which the image capturing element 2 is arranged, and the shield 29 are thermally bonded by using thermal conducive rubber 32 is similar in the fifth and the sixth methods shown in FIGS. 7A, 7B, and 7C. However, in the fifth and the sixth methods shown in FIGS. 7A, 7B, and 7C, a difference from the first method exists in a point that the substrate 31, which is the image capturing unit 28 (namely, the image capturing surface of the image capturing element 2), and the shield 29 (namely, the display surface of the LCD 24) are placed side by side, not as opposed to each other. Here, with the fifth method shown in FIG. 7B, the thermal conductive rubber 32 is bonded to the back side of the arrangement surface of the image capturing element 2 on the substrate 31, and heat is radiated from this surface to the shield 29. In the meantime, with the sixth method shown in FIG. 7C, the thermal conductive rubber 32 is bonded to the arrangement surface of the image capturing element 2 on the substrate 31, and heat is radiated from the arrangement surface to the shield 29.

With the fifth and the sixth methods, their heat radiation efficiencies of the image capturing element 2 are not so high as the above described first method. However, these methods are effective in the case where the amount of heat produced by the image capturing element 2 is small, or in the case where a desired image capturing characteristic can be obtained only by slightly radiating the heat produced by the image capturing element 2. Additionally, the substrate 31, which is the image capturing unit 28, and the LCD 24 held by the shield 29 are placed side by side, thereby thinning the chassis of the electronic camera 100.

Figure 8:
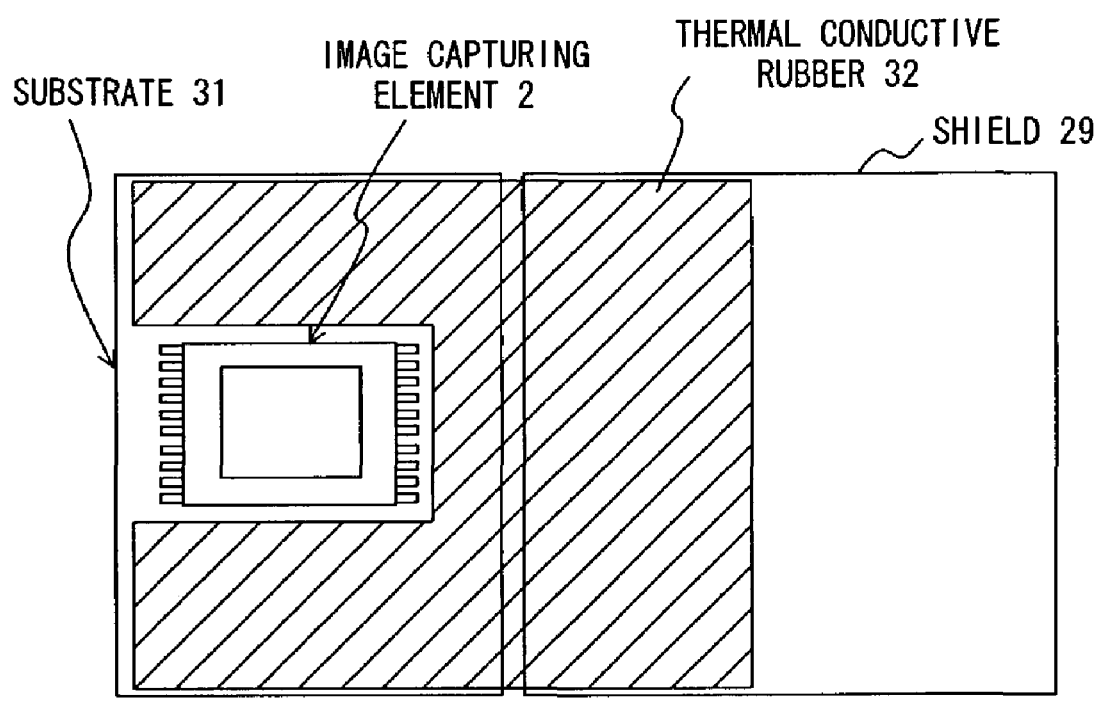
FIG. 8 shows a modification of a sixth method for thermally bonding an image capturing unit and a shield.

In the sixth method, the flat surface of the thermal conductive rubber 32 may be of a shape having a concave portion instead of a simple rectangle shown in FIG. 7B, and the image capturing element 2 may be placed in the concave portion as shown in FIG. 8. The flat surface of the thermal conductive rubber 32 is shaped like this, whereby an area where the substrate 31 and the thermal conductive rubber 32 contact is enlarged, and thermal conductivity from the substrate 31 to the shield 29 is improved, leading to an increase in the heat radiation efficiency of the image capturing element 2.

Similar to the fourth method, also heat radiation of an IC element arranged on the substrate 31 can be made by the shield 29, and a malfunction of the IC element can be prevented from occurring in the fifth and the sixth methods.

Remember that the present invention is not limited to the above described preferred embodiments, and various improvements and changes can be made.

For example, in the above described first, second, and third methods, the backlight 30 is arranged on the back side of the LCD 24. However, if the LCD 24 is not illuminated, or a display element of a self-illumination type is used instead of the LCD 24, the backlight 30 becomes unnecessary. Therefore, only the LCD 24 or such a display element may be inserted in the shield 29 and held.

Additionally, the shield 29 may not produce an effect of shielding static electricity applied to the LCD 24 on the LCD 24, and may be merely used to reinforce the strength of the LCD 24 against a physical impact.

The above described preferred embodiments refer to the implementations of an electronic camera according to the present invention. However, the present invention can be implemented, for example, as a cellular phone or a PDA (Personal Digital Assistant: personal information communication appliance of a portable type) having a shooting function, a notebook computer, or the like.

As described above in detail, according to the present invention, an image capturing unit in which a solid-state image capturing element converting a subject image into an electric signal is arranged, and a display chassis holding an image display unit on which an image to be recorded or replayed is displayed, or a static electricity shielding unit shielding static electricity applied to the image display unit or a member improving the physical strength of the image display unit are thermally bonded, whereby the heat produced by the solid-state image capturing element is well transferred to the display chassis or the static electricity shielding unit. As a result, the heat of the solid-state image capturing element is radiated without arranging a dedicated radiator, which produces the effect of maintaining the high image quality of a captured image.

What is claimed is:

1. An image capturing device, comprising:
   an image capturing unit in which a solid-state image capturing element converting a subject image into an electric signal is arranged;
   a display chassis that holds an image display unit on which an image to be recorded or replayed is displayed; and
   means, arranged between said image capturing unit and said display chassis, for conducting heat produced by said image capturing unit so that such heat is radiated by said display chassis, wherein said display chassis is thermally bonded to said image capturing unit.

2. The image capturing device according to claim 1, further comprising
   a display illuminating unit, which is placed on a back side of the image display unit and arranged between the image display unit and said display chassis, illuminates the image display unit.

3. The image capturing device according to claim 1, wherein
   said display chassis shields static electricity applied to the image display unit.

4. The image capturing device according to claim 1, wherein
   said display chassis is configured to improve physical strength of the image display unit by holding the image display unit.

5. The image capturing device according to claim 1, wherein:
   said image capturing unit comprises a substrate on which the solid-state image capturing element is arranged; and
   the substrate is placed as opposed to said display chassis.

6. The image capturing device according to claim 1, wherein
   the thermal conductive member has elasticity.

7. The image capturing device according to claim 1, wherein
   said display chassis, the solid-state image capturing element, and the thermal conductive member are arranged on a same axis.

8. The image capturing device according to claim 1, wherein.
   said image capturing unit comprises a substrate on which the solid-state image capturing element is arranged; and
   said display chassis is thermally bonded to said image capturing unit by arranging the thermal conductive member between the substrate and said display chassis.

9. The image capturing device according to claim 8, wherein.
   the image display unit held by said display chassis and the substrate are placed side by side; and
   the thermal conductive member is bonded to a back side of an arrangement surface of the solid-state image capturing element on the substrate.

10. The image capturing device according to claim 8, wherein.
    the image display unit held by said display chassis and the substrate are placed side by side; and
    the thermal conductive member is bonded to an arrangement surface of the solid-state image capturing element on the substrate.

11. The image capturing device according to claim 1, wherein
    said display chassis radiates heat produced by the solid-state image capturing element that is arranged in said image capturing unit, and also radiates heat produced by a semiconductor element arranged in said image capturing unit.

12. The image capturing device of claim 1 wherein the display chassis is thermally bonded to the image capturing unit such that heat generated by the image capturing unit is transferred away from the image capturing unit via the display chassis.

13. An image capturing device, comprising:
    an image capturing unit in which a solid-state image capturing element converting a subject image into an electric signal is arranged;
    a static electricity shielding unit that shields static electricity applied to an image display unit on which an image to be recorded or replayed is displayed; and
    means,arranged between said image capturing unit and said static electricity shielding unit, for conducting heat produced by said image capturing unit so that such heat is radiated by said static electricity shielding unit, wherein said static electricity shielding unit is thermally bonded to said image capturing unit.

14. An assembly comprising:
    a) a display;
    b) a shield accommodating the display;
    c) an image capturing unit including an image capturing element; and
    d) an element arranged between the shield and the image capturing unit, the element being formed of a thermally conductive material which permits heat generated by the image capturing unit to be transferred, via the element, to the shield, wherein the element is a thermally conductive rubber.

15. The assembly of claim 14 wherein the shield is formed of a thermally conductive metal.

16. An image capturing device, comprising.
    an image capturing unit in which a solid-state image capturing element converting a subject image into an electrical signal is arranged; and a display chassis that holds an image display unit on which an image to be recorded or replayed is displayed, and is thermally bonded to said image capturing unit, wherein said display chassis is thermally bonded to said image capturing unit by arranging a thermal conductive member, which guides heat produced by said image capturing unit to said display chassis, between said image capturing unit and said display chassis, and said thermal conductive member is a thermally conductive rubber.

17. An image capturing device, comprising:

an image capturing unit in which a solid-state image capturing element converting a subject image into an electrical signal is arranged; and a display chassis that holds an image display unit on which an image to be recorded or replayed is displayed, and is thermally bonded to said image capturing unit, wherein said display chassis is thermally bonded to said image capturing unit by arranging a thermal conductive member, which guides heat produced by said image capturing unit to said display chassis, between said image capturing unit and said display chassis, and said thermal conductive member is a metal spring.

* * * * *